United States Patent
Chiu (10) Patent No.: US 9,241,423 B2
(45) Date of Patent: Jan. 19, 2016

(54) FLUID-COOLED HEAT DISSIPATION DEVICE

(71) Applicant: INTEL CORPORATION, Santa Clara, CA (US)

(72) Inventor: Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 218 days.

(21) Appl. No.: 13/860,937

(22) Filed: Apr. 11, 2013

(65) Prior Publication Data

US 2014/0307388 A1 Oct. 16, 2014

(51) Int. Cl.
| | |
|---|---|
| *H05K 7/20* | (2006.01) |
| *H05K 1/00* | (2006.01) |
| *H01R 13/46* | (2006.01) |
| *H05K 3/30* | (2006.01) |
| *F28F 9/00* | (2006.01) |
| *F28F 3/12* | (2006.01) |
| *H01L 23/473* | (2006.01) |
| *F04B 17/00* | (2006.01) |

(52) U.S. Cl.
CPC ............ *H05K 7/20254* (2013.01); *F28F 3/12* (2013.01); *H01L 23/473* (2013.01); *H05K 7/20* (2013.01); *F04B 17/00* (2013.01); *H01L 2924/0002* (2013.01); *H05K 7/20236* (2013.01)

(58) Field of Classification Search
CPC ............ F04B 17/00; F28F 3/12; H05K 7/20; H05K 7/20236
USPC .............. 361/688, 689, 699, 676–678, 361/679.46–679.54, 690–698, 700–723, 361/831; 174/252, 520, 526; 165/80.4, 170; 257/714

See application file for complete search history.

(56) References Cited

U.S. PATENT DOCUMENTS

| | | | | |
|---|---|---|---|---|
| 6,767,765 | B2 * | 7/2004 | Chiu | 438/122 |
| 7,316,263 | B2 * | 1/2008 | Lofland et al. | 165/80.4 |
| 2005/0232795 | A1 * | 10/2005 | Seko et al. | 417/423.14 |
| 2011/0317368 | A1 * | 12/2011 | Pautsch et al. | 361/702 |
| 2014/0126150 | A1 * | 5/2014 | Song et al. | 361/699 |

* cited by examiner

*Primary Examiner* — Courtney Smith
*Assistant Examiner* — Zhengfu Feng
(74) *Attorney, Agent, or Firm* — Winkle, PLLC (57) ABSTRACT

A heat dissipation device that includes a base plate having a plurality of substantially circular channels which are substantially concentrically arranged; and a fluid distribution structure adjacent the base plate, wherein the fluid distribution structure has a plurality of inlet conduits extending substantially radially from a central area with each of the plurality of inlet conduits having at least one fluid delivery port extending through the fluid distribution structure to at least one base plate circular channel, and wherein the fluid distribution structure has a plurality of outlet zones defined between adjacent inlet conduits with each of the plurality of outlet zones having at least one fluid removal port extending through the fluid distribution structure to at least one base plate circular channel.

30 Claims, 10 Drawing Sheets

FLUID-COOLED HEAT DISSIPATION DEVICE

TECHNICAL FIELD

Embodiments of the present description generally relate to the field of heat dissipation from a microelectronic device, and, more specifically, to a heat dissipation device having a base plate including a plurality of circular channels and a fluid distribution structure for distributing a cooling fluid into and out of the base plate circular channels.

BACKGROUND ART

The microelectronic industry is continually striving to produce ever faster and smaller microelectronic devices for use in various mobile electronic products, such as portable computers, electronic tablets, cellular phones, digital cameras, and the like. As these goals are achieved, the density of power consumption of integrated circuit components within the microelectronic devices has increased, which, in turn, increases the average junction temperature of the microelectronic device. If the temperature of the microelectronic device becomes too high, the integrated circuits within the microelectronic device may be damaged or destroyed. Therefore, there is an ongoing effort to design ever more efficient and cost-effective heat dissipation devices for microelectronic devices.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to a heat dissipation device that includes a base plate having a plurality of substantially circular channels which are substantially concentrically arranged; and a fluid distribution structure adjacent the base plate, wherein the fluid distribution structure has a plurality of inlet conduits extending substantially radially from a central area with each of the plurality of inlet conduits having at least one fluid inlet port extending through the fluid distribution structure to at least one base plate circular channel, and wherein the fluid distribution structure has a plurality of outlet zones defined between adjacent inlet conduits with each of the plurality of outlet zones having at least one fluid outlet port extending through the fluid distribution structure to at least one base plate circular channel. The heat dissipation may further include a cap structure for fluid containment into and out of the base plate/fluid distribution structure combination.

Figure 1:
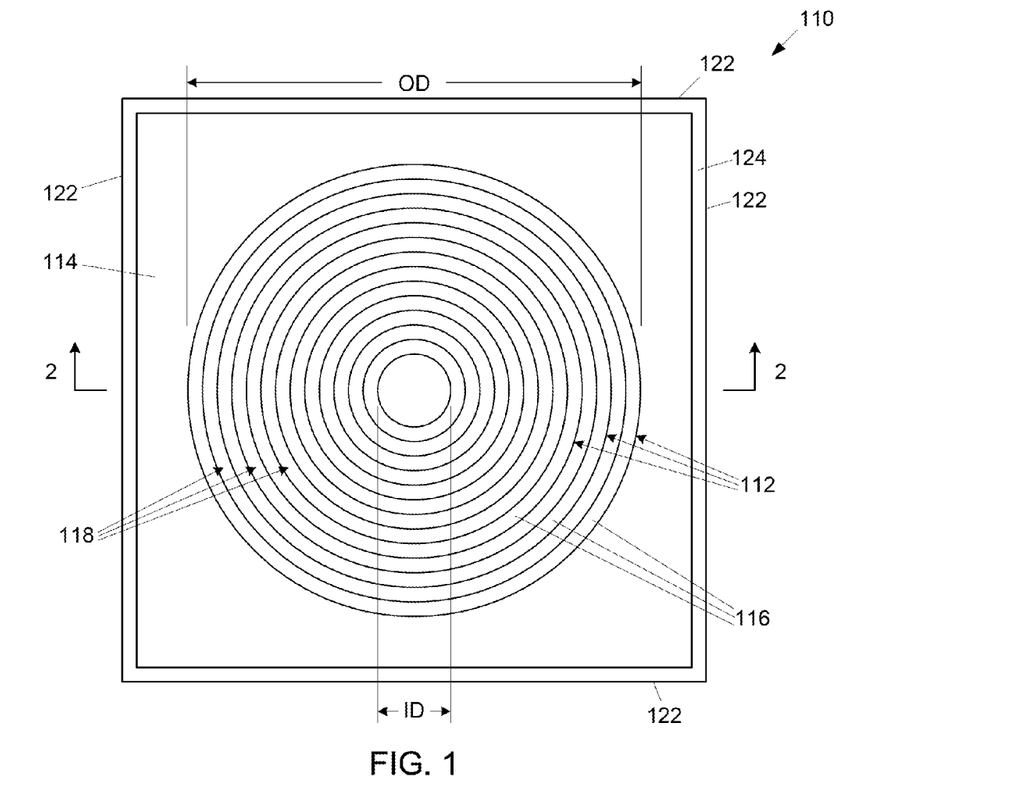
FIG. 1 illustrates a top plan view of a base plate of a heat dissipation device, according to one embodiment of the present description.
Figure 2:
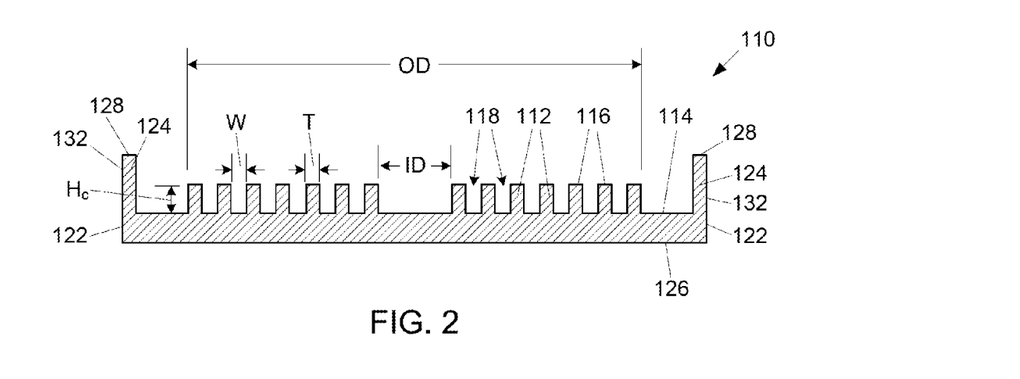
FIG. 2 illustrates a side cross-sectional view of the base plate along line 2-2 of FIG. 1, according to one embodiment of the present description.
Figure 3:
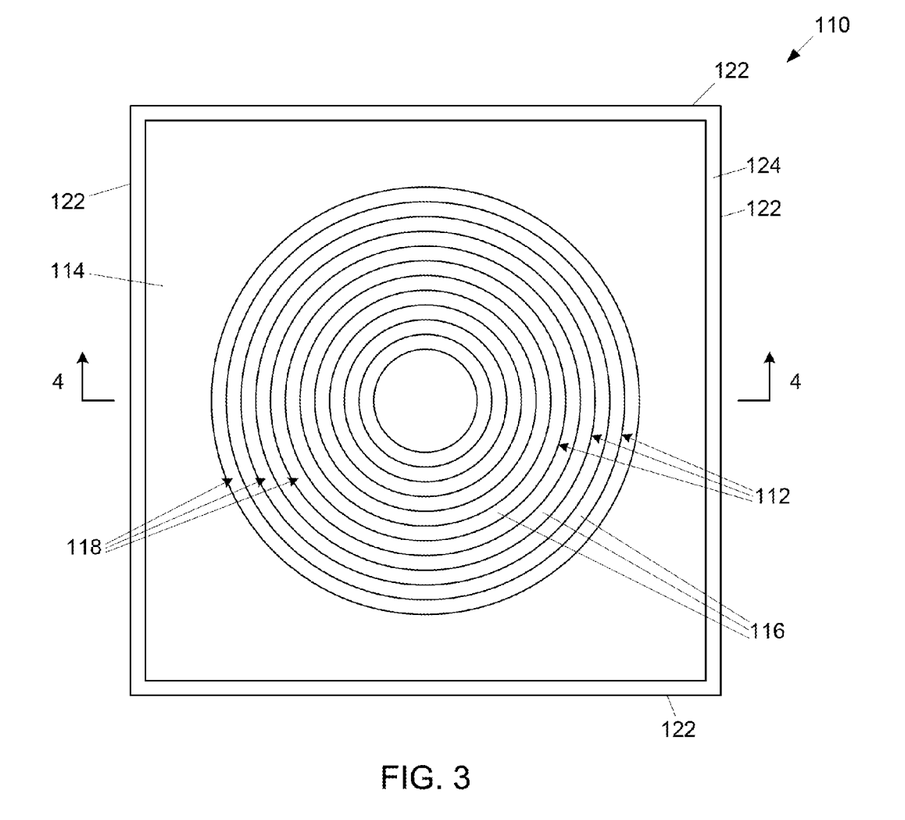
FIG. 3 illustrates a top plan view of a base plate for a heat dissipation device, according to another embodiment of the present description.
Figure 4:
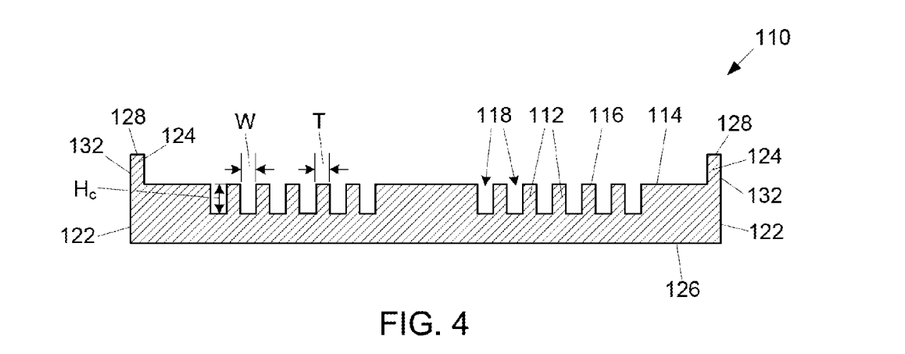
FIG. 4 illustrates a side cross-sectional view of the base plate along line 4-4 of FIG. 3, according to another embodiment of the present description.

As shown in FIGS. 1 and 2, a base plate 110 may be fabricated by forming a plurality of substantially concentric walls 112 extending from a first surface 114 of the base plate 110 and terminating with a top surface 116. The openings between the substantially concentric walls 112 define channels 118. It is understood that the base plate channels 118 may be formed by forming trenches into the base plate 110, as shown in FIGS. 3 and 4. The base plate 110 may have a second surface 126 substantially opposing the base plate first surface 114. The base plate 110 may be formed from any appropriate material, such as a highly thermally conductive material, including but not limited to copper, aluminum, alloys thereof, and the like. The base plate 110 may be fabricated by any known technique, including but not limited to molding, machining, and the like.

Referring to FIG. 1, in one embodiment, the base plate 110 may be rectilinear having four sides 122 of about 50 mm in length. Referring to FIG. 2, the base plate walls 112 may extend substantially perpendicularly from base plate first surface to a height $H_c$ of about 1 mm and may have a thickness T of about 100 μm. The positioning and size of the base plate walls 112 may result in the base plate channels 118 having an width W of about 100 μm, wherein an outermost base plate wall 112 may have an outside diameter OD of about 40 mm and innermost base plate wall 112 may have an inside diameter ID of about 5 mm.

The base plate 110 may further include at least one sidewall 124 extending substantially perpendicularly from the base plate first surface 114 proximate at least one base plate side 122 and terminate in a top surface 128. The base plate sidewall 124 may further include an outer surface 132. The functionally of the at least one base plate sidewall 124 will be subsequently discussed.

Figure 5:
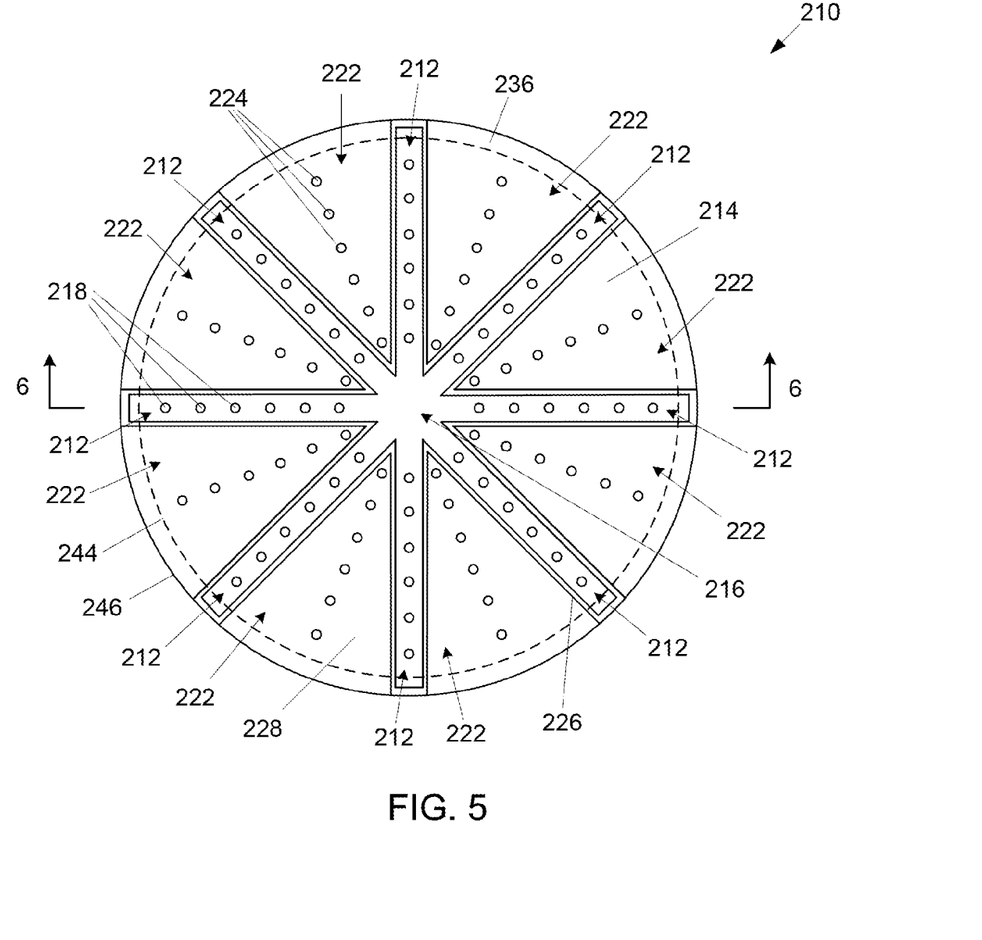
FIG. 5 illustrates a top plan view of a fluid distribution structure for a heat dissipation device, according to an embodiment of the present description.
Figure 6:
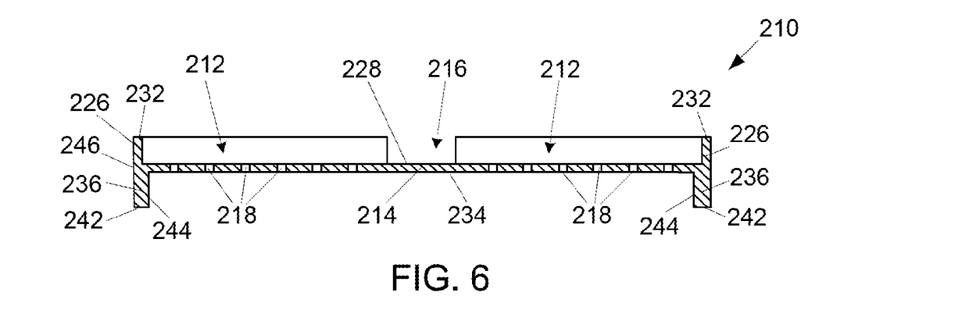
FIG. 6 illustrates a side cross-sectional view of the fluid distribution structure along line 6-6 of FIG. 5, according to an embodiment of the present description.

As shown in FIGS. 5 and 6, a fluid distribution structure 210 may be formed by forming a plurality of inlet conduits 212 on a substantially circular plate 214, wherein the plurality of inlet conduits 212 extend substantially radially from a central area 216 of the fluid distribution structure 210. Each of the inlet conduits 212 may have at least one fluid delivery port 218 extending through the fluid distribution structure plate 214 from a first surface 228 to a second surface 234 thereof. The fluid distribution structure 210 may have a plurality of outlet zones 222 defined between adjacent inlet conduits 212 with each of the plurality of outlet zones having at least one fluid outlet port 224 extending through the fluid distribution structure plate 214. The plurality of inlet conduits 212 and outlet zones 222 may be defined by walls 226 extending substantially perpendicularly from the first surface 228 of the fluid distribution structure plate 214 and terminating with a top surface 232, which separate the plurality of inlet conduits 212 from the outlet zones 222. The fluid distribution structure 210 may further include at least one flange 236 extending substantially perpendicularly from the second surface 234 of the fluid distribution structure plate 214 to terminate in a bottom surface 242 and having an inner surface 244. The at least one fluid distribution structure flange 244 may be positioned near a periphery 246 of the fluid distribution structure 210.

The fluid distribution structure 210 may be formed from any appropriate material, such as a thermally conductive material, including but not limited to copper, aluminum, alloys thereof, and the like, or a low thermally conductive material, including but not limited to plastic materials. The fluid distribution structure 210 may be fabricated by any known technique, including but not limited to molding, machining, and the like.

Figure 7:
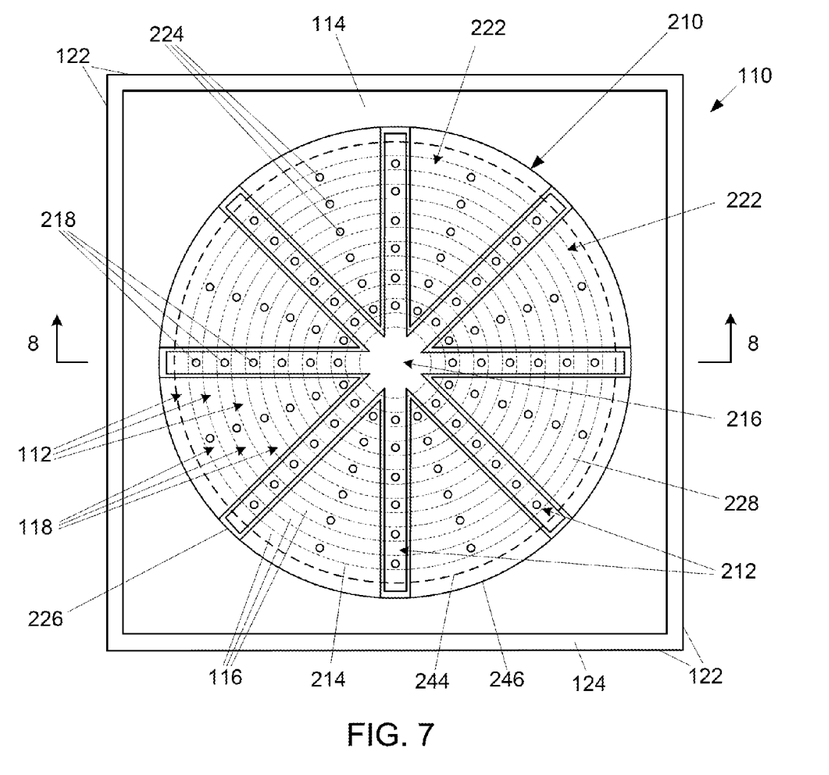
FIG. 7 illustrates a top plan view of a fluid distribution structure of FIG. 5 assembled with the a base plate of FIG. 1, according to an embodiment of the present description.
Figure 8:
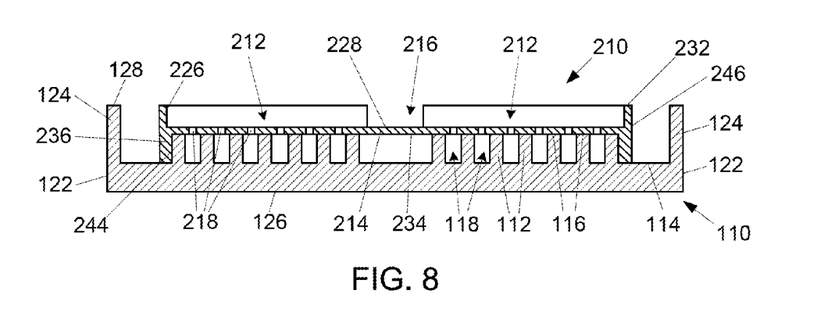
FIG. 8 illustrates a side cross-sectional view of the assembly of FIG. 7 along line 8-8, according to an embodiment of the present description.
Figure 9:
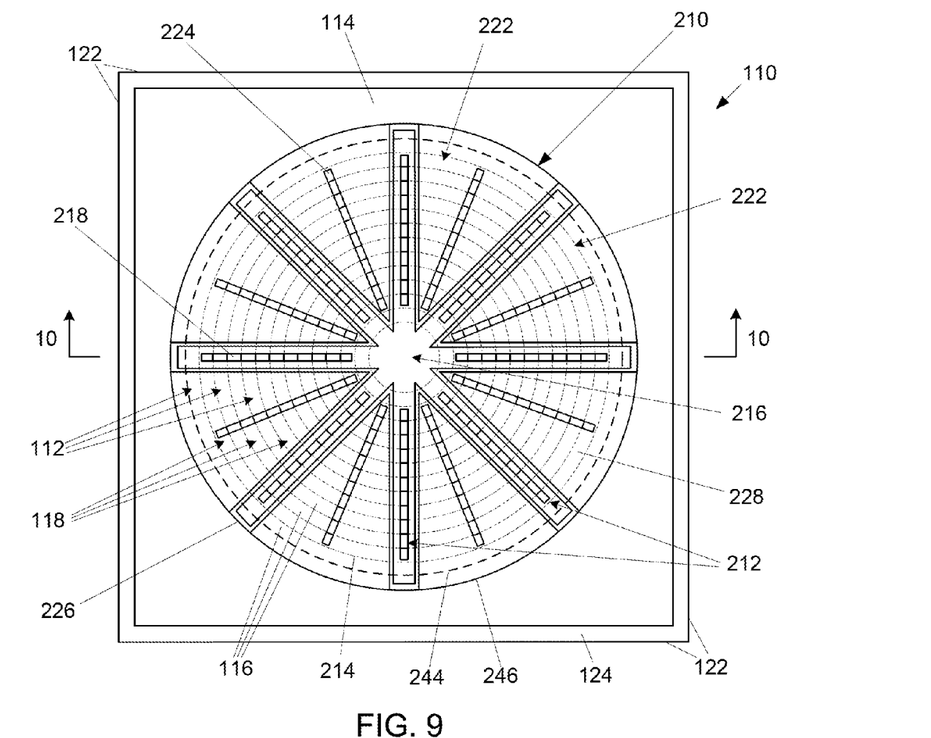
FIG. 9 illustrates a top plan view of a fluid distribution structure, having slotted fluid input and outlet ports, assembled with the a base plate of FIG. 1, according to an embodiment of the present description.
Figure 10:
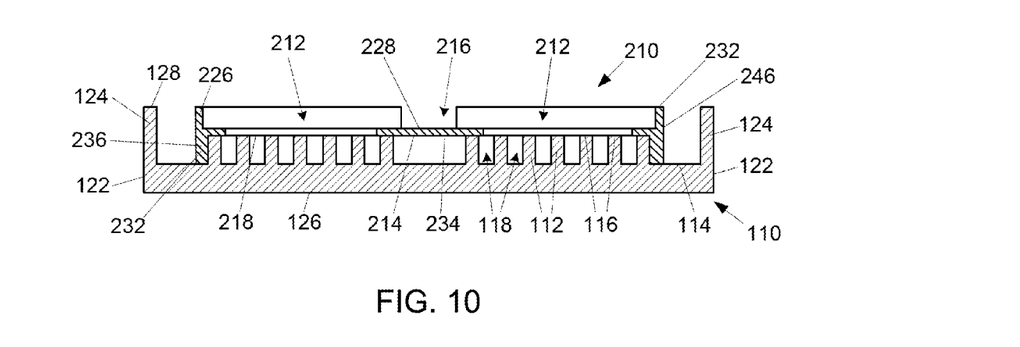
FIG. 10 illustrates a side cross-sectional view of the assembly of FIG. 9 along line 10-10, according to an embodiment of the present description.

As shown in FIGS. 7 and 8, the fluid distribution structure 210 may be assembled with the base plate 110, such that the fluid distribution structure flange inner surface 244 abuts the outside diameter OD (see FIGS. 1 and 2) of an outermost base plate wall 112. The base plate wall top surfaces 116 may contact and may substantially seal with the fluid distribution structure plate second surface 234. As further shown in FIGS. 7 and 8, the fluid distribution structure fluid delivery ports 218 and the fluid distribution structure fluid removal ports 224 may be arranged to open to respective base plate channels 118. As shown in FIGS. 9 and 10, the fluid distribution structure fluid delivery ports 218 need not be a plurality of ports each opening to a respective base plate channel 118, but may be slot extending along the inlet conduit 212 to provide an opening to all of the base plate channels 118. Likewise, the fluid distribution structure fluid removal ports 224 need not be a plurality ports each opening to a respective base plate channel 118, but may be slot extending along the outlet zone 222 to provide an opening to all of the base plate channels 118.

Figure 11:
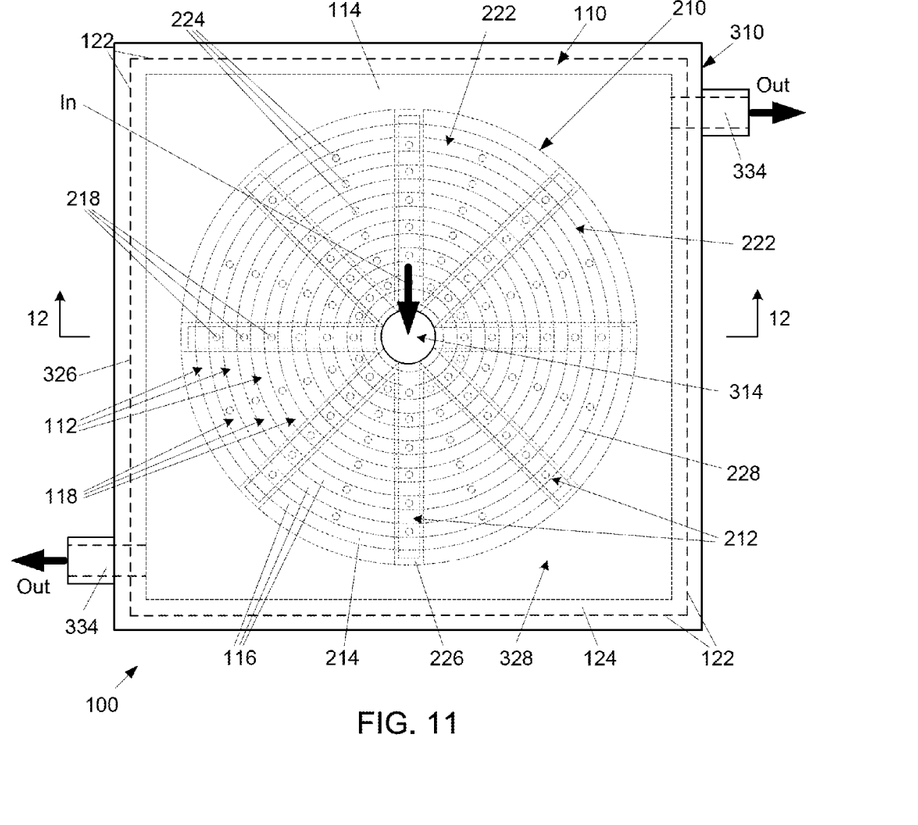
FIG. 11 illustrates a top plan view of a cap structure assembled with the fluid distribution structure and the base plate, according to an embodiment of the present description.
Figure 12:
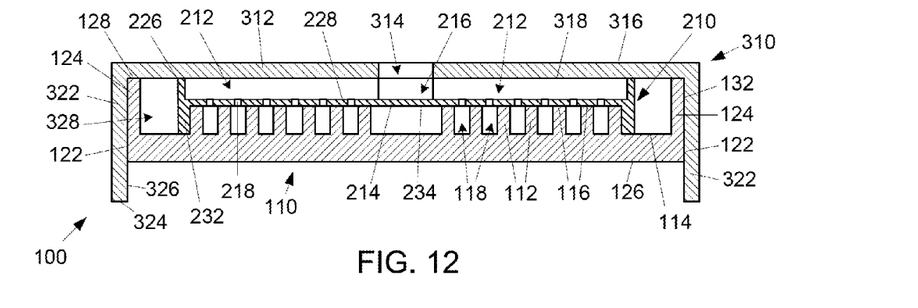
FIG. 12 illustrates a side cross-sectional view of the assembly of FIG. 11 along line 12-12, according to an embodiment of the present description.

As shown in FIGS. 11 and 12, a cap structure 310 may be assembled with the base plate 110 and the fluid distribution structure 210 to form a heat dissipation device 100. The cap structure 310 may comprise a plate 312 having an inlet port 314 formed therethrough from a first surface 316 of the cap structure plate 312 to an opposing second surface 318 of the cap structure plate 312. The cap structure inlet port 314 may be positioned to provide an opening to the fluid distribution structure central area 216 to accommodate a flow of a heat dissipation fluid (illustrated as arrow "In") into the fluid distribution structure central area 216. The cap structure 310 may further include at least one sidewall 322 extending from the cap structure plate first surface 316 terminating in a bottom surface 324 (see FIG. 12) and may have an inner surface 326.

When the cap structure 310 is assembled with the base plate 110 and the fluid distribution structure 210, the cap structure sidewall inner surface 326 may abut the base plate sidewall outer surface 132 and the base plate sidewall top surface 128 may abut the cap structure plate second surface 318. The fluid distribution structure wall(s) 226 may contact the cap structure plate second surface 318 to enclose the fluid distribution structure inlet conduits 212. A fluid collection chamber 328 may be defined between the cap structure plate second surface 318, the base plate sidewall 124, the base plate first surface 114, and the fluid distribution structure 210. The cap structure 310 may further include at least one outlet port 334 with an opening therethrough and through the base plate sidewall 124 to the fluid collection chamber 328 for the removal of the heat dissipation fluid (illustrated as arrows "Out"), as will be discussed. It is understood that any sealing material known in the art may be utilized between any of the mention abutting surfaces.

Figure 13:
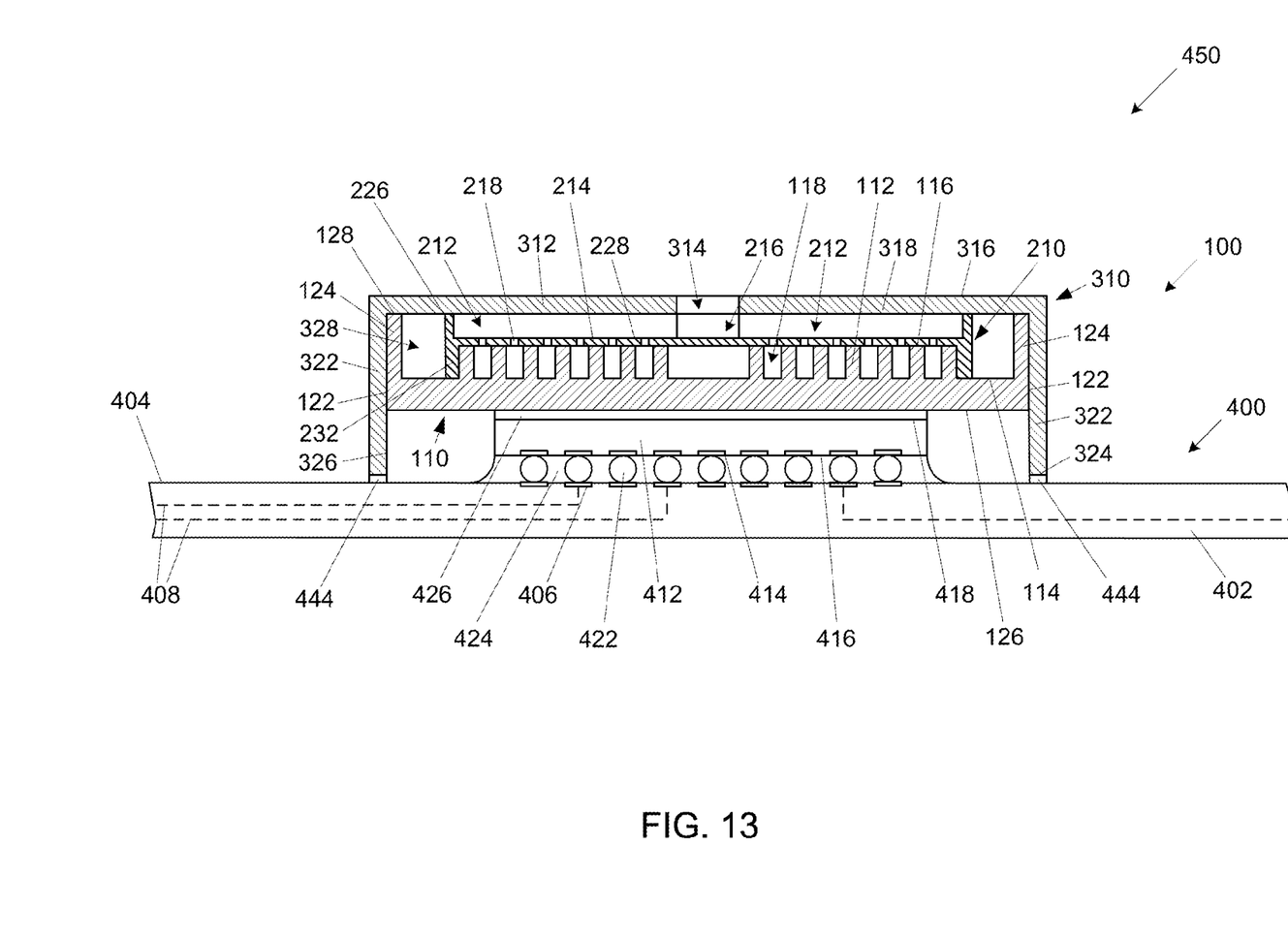
FIG. 13 illustrates a side cross-sectional view of the assembly of FIG. 12 attached to a microelectronic structure, according to an embodiment of the present description.

As shown in FIG. 13, the heat dissipation device 100 may be attached to a microelectronic structure 400 to form a microelectronic device 450. The microelectronic structure 400 may be formed by providing or forming a microelectronic substrate 402, such as a printed circuit board, motherboard, or the like, with a microelectronic device 412, such as a microprocessor, a multichip package, a chipset, a graphics device, a wireless device, a memory device, an application specific integrated circuit device, and the like, attached to a first surface 404 of the microelectronic substrate 402 with a plurality of interconnects 422. The device-to-substrate interconnects 422, such as soldered interconnects, may extend between bond pads 414 formed in or on an active surface 416 of the microelectronic device 412 and substantially mirror-image bond pads 406 in or on the microelectronic substrate first surface 404. An underfill material 424, such as an epoxy material, may be disposed between the microelectronic device active surface 416 and the microelectronic substrate first surface 404.

As further shown in FIG. 13, the microelectronic substrate 402 may provide electrical communication routes (illustrated as dashed lines 408) between the microelectronic device 412 and external components (not shown). As will be understood to those skilled in the art, the microelectronic device bond pads 414 are in electrical communication with integrated circuitry (not shown) within the microelectronic device 412.

The heat dissipation device 100 may be attached to the microelectronic substrate first surface 404 such that the base plate back surface 126 is in thermal contact with a back surface 418 (opposing the microelectronic device active surface 416) of the microelectronic device 412. As shown, a thermal interface material 426 may be disposed between the base plate back surface 126 and the microelectronic device back surface 418. The cap structure sidewall(s) 322 may be attached to the microelectronic substrate 402 by any appropriate means, including but not limited to an adhesive material 444, such as an epoxy.

Figure 14:
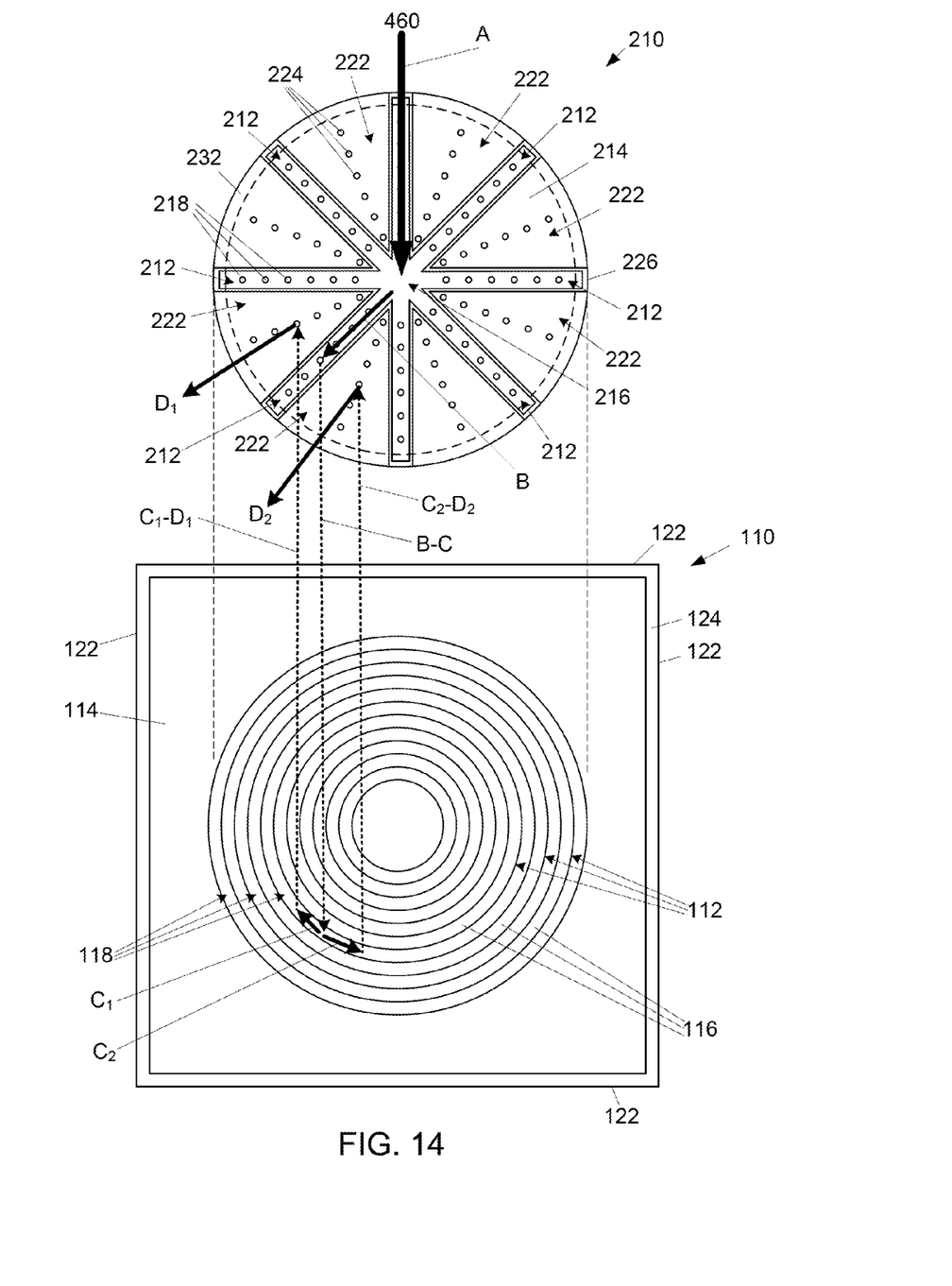
FIG. 14 illustrates an exploded top plan view of the fluid distribution structure and the base plate showing an example of fluid movement therethrough, according to an embodiment of the present description.

FIG. 14 shows an exploded view of a base plate 110 and a fluid distribution structure 210 to illustrate the flow of a heat dissipation fluid 460 therethrough. The heat dissipation fluid 460 may be first delivered to the fluid distribution structure central area 216, as illustrated with arrow A. A portion of the heat dissipation fluid 460 may flow into one of the fluid distribution structure inlet conduits 212, as illustrated with arrow B. A portion of the heat dissipation fluid 460 may flow through at least one of the fluid delivery port 218 and into at least one base plate channel 118, as illustrated with arrow B-C. Portions of the heat dissipation fluid 460 may travel in the base plate channels 118 in opposing directions, illustrated as arrows $C_1$ and $C_2$. The heat dissipation fluid 460 may then exit through at least one of the fluid distribution structure fluid removal port 224, illustrated as arrows $C_1$-$D_1$ and $C_2$-$D_2$ into at least one of the fluid distribution structure outlet zones 222 and exit the fluid distribution structure outlet zones 222, such as illustrated with arrows $D_1$ and $D_2$. Referring in addition to the FIGS. 11 and 12, the heat dissipation fluid 460 would be delivered through the cap structure inlet port 314 and the heat dissipation fluid 460 flowing from the fluid distribution structure outlet zones 222 may collect in the fluid collection chamber 328 and be removed through the outlet ports 334.

In one embodiment, the heat dissipation fluid 460 may be a liquid, including but not limited to, water, alcohol, glycol, combinations thereof, and the like. In another embodiment, the heat dissipation fluid 460 may be a mixture of a liquid and a gas. In still another embodiment, the fluid heat dissipation fluid 460 may be an expandable fluid, such as a refrigerant, such that two-phase flow may be result. For example, the heat dissipation fluid 460 entering the base plate channels 118 from the fluid distribution structure fluid delivery ports 218 may be a liquid phase flow, but at least a portion of the heat dissipation fluid 460 may be a vapor or gas phase flow as the heat dissipation fluid 460 exits the base plate channels 118 through the fluid distribution structure fluid removal ports 224. Accordingly, latent heat of vaporization may be transferred from the microelectronic device back surface 418 into the liquid phase heat dissipation fluid 460 to result in the formation of the vapor or gas phase. Consequently, as will be understood to those skilled in the art, laminar liquid fluid flow may be disrupted and driven toward turbulent flow by flashing (the change from liquid to vapor phase) of the heat dissipation fluid 460. Similarly, already turbulent liquid fluid flow may be disrupted and driven toward more turbulent flow by the flashing of the heat dissipation fluid 460.

Figure 15:
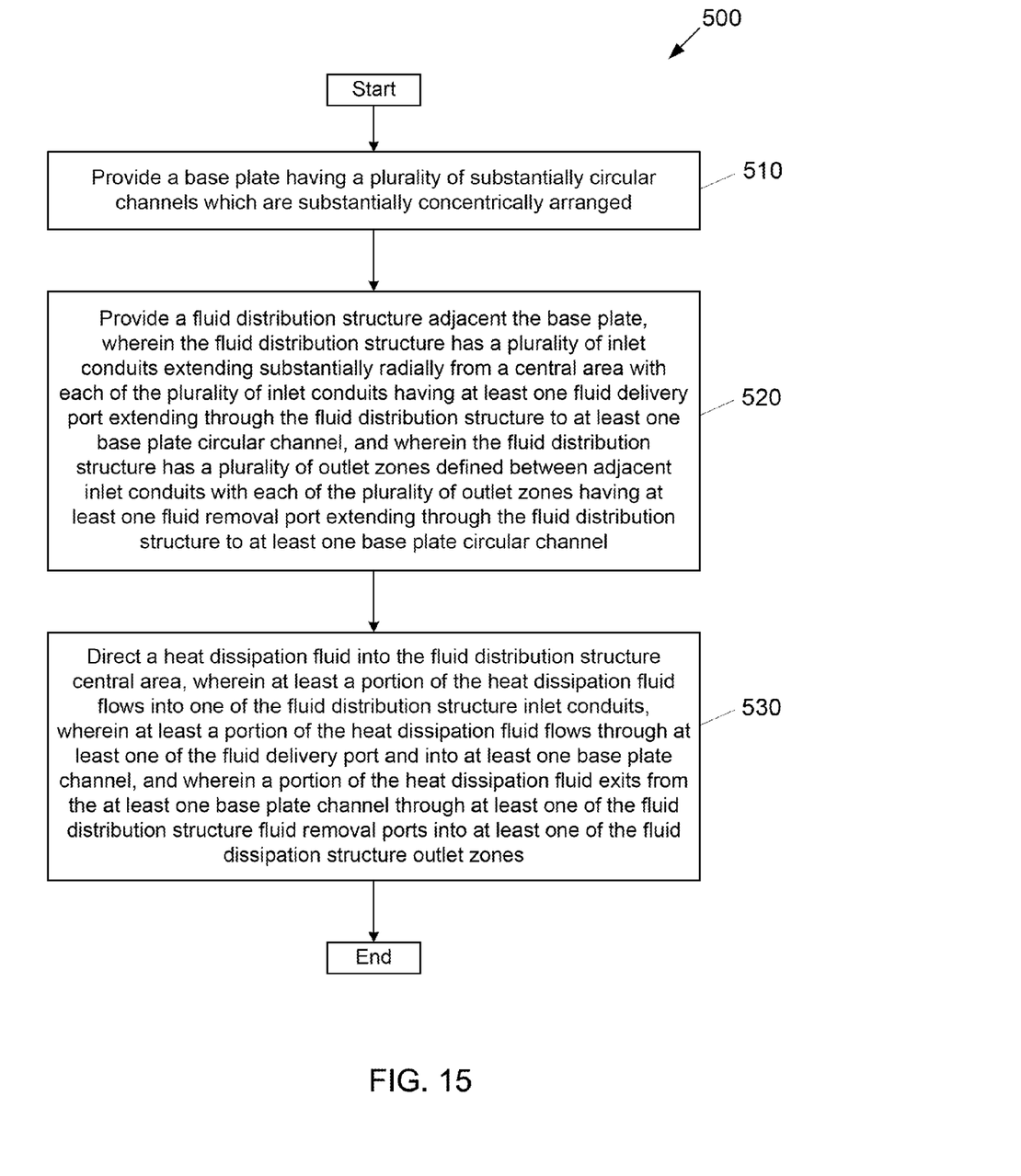
FIG. 15 is a flow chart of a process of utilizing the heat dissipation device, according to an embodiment of the present description.

FIG. 15 is a flow chart of a process 500 of fabricating a microelectronic structure according to the various embodiments of the present description. As set forth in block 510, a base plate having a plurality of substantially circular channels which are substantially concentrically arranged may be provided. A fluid distribution structure adjacent the base plate may be provided, wherein the fluid distribution structure has a plurality of inlet conduits extending substantially radially from a central area with each of the plurality of inlet conduits having at least one fluid inlet port extending through the fluid distribution structure to at least one base plate circular channel, and wherein the fluid distribution structure has a plurality of outlet zones defined between adjacent inlet conduits with each of the plurality of outlet zones having at least one fluid outlet port extending through the fluid distribution structure to at least one base plate circular channel, as set forth in block 520. As set forth in block 530, a heat dissipation fluid may be directed into the fluid distribution structure central area, wherein at least a portion of the heat dissipation fluid flows into one of the fluid distribution structure inlet conduits, wherein at least a portion of the heat dissipation fluid travels through at least one of the fluid delivery ports and into at least one base plate channel, and wherein a portions of the heat dissipation fluid exits through at least one of the fluid distribution structure fluid removal ports into at least one of the fluid distribution structure outlet zones.

Figure 16:
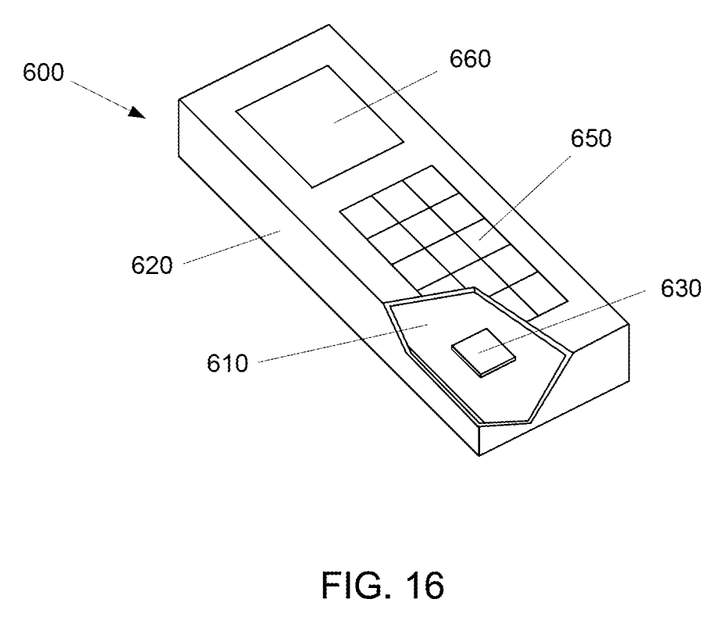
FIG. 16 illustrates an electronic system, according to one embodiment of the present description.

FIG. 16 illustrates an embodiment of an electronic system/device 600, such as a portable computer, a desktop computer, a mobile telephone, a digital camera, a digital music player, a web tablet/pad device, a personal digital assistant, a pager, an instant messaging device, or other devices. The electronic system/device 600 may be adapted to transmit and/or receive information wirelessly, such as through a wireless local area network (WLAN) system, a wireless personal area network (WPAN) system, and/or a cellular network. The electronic system/device 600 may include a microelectronic motherboard or substrate 610 disposed within a device housing 620. The microelectronic motherboard/substrate 610 may have various electronic components electrically coupled thereto including a microelectronic device having a heat dissipation device disposed thereon, as described in the present description (see FIG. 13). The microelectronic device and the heat dissipation device are shown generically as element 630 (details of these components have been shown and described with regard to FIGS. 1-14). The microelectronic motherboard 610 may be attached to various peripheral devices including an input device 650, such as keypad, and a display device 660, such an LCD display. It is understood that the display device 660 may also function as the input device, if the display device 660 is touch sensitive.

It is understood that the subject matter of the present description is not necessarily limited to specific applications illustrated in FIGS. 1-16. The subject matter may be applied to other microelectronic device applications, as well as applications outside of the microelectronic industry, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A heat dissipation device, comprising:
a base plate formed as a single component and having a plurality of substantially circular channels formed in the base plate which are substantially concentrically arranged; and
a fluid distribution structure adjacent to the base plate, wherein the fluid distribution structure has a plurality of inlet conduits extending substantially radially from a central area with each of the plurality of inlet conduits having at least one fluid delivery port extending through the fluid distribution structure to at least one base plate circular channel, and wherein the fluid distribution structure has a plurality of outlet zones defined between adjacent inlet conduits with each of the plurality of outlet zones having at least one fluid removal port extending through the fluid distribution structure to at least one base plate circular channel.

2. The heat dissipation device of claim 1, wherein the plurality of substantially circular channels of the base plate are defined by a plurality of substantially concentric walls extending from a first surface of the base plate.

3. The heat dissipation device of claim 2, wherein the fluid distribution structure further includes at least one flange extending from a bottom surface thereof, wherein the at least one flange includes an inner surface which abuts an outside diameter of an outmost wall of the plurality of substantially concentric walls of the base plate.

4. The heat dissipation device of claim 1, wherein the plurality of the substantially circular channels are defined by a plurality of substantially concentric openings extending into the base plate from a first surface thereof.

5. The heat dissipation device of claim 1, wherein the base plate is thermally conductive.

6. The heat dissipation device of claim 1, wherein the fluid distribution structure inlet conduits are defined by at least one wall extending from a base of the fluid distribution structure.

7. The heat dissipation device of claim 6, further comprising a cap structure assembled with the base plate and the fluid distribution structure, wherein the cap structure includes a plate having an inlet port formed therethrough from a first surface of the cap structure plate to an opposing second surface of the cap structure plate, and wherein the cap structure inlet port is positioned to provide an opening to the fluid distribution structure central area.

8. The heat dissipation device of claim 7, wherein the at least one fluid distribution structure wall contacts the cap structure plate second surface to enclose the fluid distribution structure inlet conduits.

9. The heat dissipation device of claim 7, wherein the cap structure further includes at least one sidewall extending from the cap structure plate first surface terminating in a bottom surface and having an inner surface.

10. The heat dissipation device of claim 9, wherein the base plate further includes at least one sidewall extending from the base plate first surface terminating in a top surface and includes an outer surface, and wherein the cap structure sidewall inner surface abuts the base plate sidewall outer surface.

11. The heat dissipation device of claim 10, further including a fluid collection chamber defined between the cap structure plate second surface, the base plate sidewall, the base plate first surface, and the fluid distribution structure.

12. The heat dissipation device of claim 11, wherein the cap structure further includes at least one outlet port with an opening extending through the base plate sidewall to the fluid collection chamber.

13. A device, comprising:
a microelectronic structure including a microelectronic substrate with a microelectronic device having an active surface electrically attached to a first surface of the microelectronic substrate, wherein the microelectronic device further including a back surface opposing the microelectronic device active surface; and
a heat dissipation device comprising:
a base plate formed as a single component and having a plurality of substantially circular channels formed in the base plate which are substantially concentrically arranged; and
a fluid distribution structure adjacent to the base plate, wherein the fluid distribution structure has a plurality of inlet conduits extending substantially radially from a central area with each of the plurality of inlet conduits having at least one fluid delivery port extending through the fluid distribution structure to at least one base plate circular channel, and wherein the fluid distribution structure has a plurality of outlet zones defined between adjacent inlet conduits with each of the plurality of outlet zones having at least one fluid removal port extending through the fluid distribution structure to at least one base plate circular channel;
wherein the heat dissipation device is attached to the microelectronic substrate first surface such that the base plate back surface is in thermal contact with the microelectronic device back surface.

14. The device of claim 13, further comprising a thermal interface material disposed between the base plate back surface and the microelectronic device back surface.

15. The device of claim 13, wherein the plurality of substantially circular channels of the base plate are defined by a plurality of substantially concentric walls extending from a first surface of the base plate.

16. The device of claim 15, wherein the fluid distribution structure further includes at least one flange extending from a bottom surface thereof, wherein the at least one flange includes an inner surface which abuts an outside diameter of an outmost wall of the plurality of substantially concentric walls of the base plate.

17. The device of claim 13, wherein the plurality of the substantially circular channels are defined by a plurality of substantially concentric openings extending into the base plate from a first surface thereof.

18. The device of claim 13, wherein the base plate is thermally conductive.

19. The device of claim 13, wherein the fluid distribution structure inlet conduits are defined by at least one wall extending from a base of the fluid distribution structure.

20. The device of claim 19, further comprising a cap structure assembled with the base plate and the fluid distribution structure, wherein the cap structure includes a plate having an inlet port formed therethrough from a first surface of the cap structure plate to an opposing second surface of the cap structure plate, and wherein the cap structure inlet port is positioned to provide an opening to the fluid distribution structure central area.

21. The device of claim 20, wherein the at least one fluid distribution structure wall contacts the cap structure plate second surface to enclose the fluid distribution structure inlet conduits.

22. The device of claim 20, wherein the cap structure further includes at least one sidewall extending from the cap structure plate first surface terminating in a bottom surface and having an inner surface.

23. The device of claim 22, wherein the cap structure further includes at least one sidewall bottom surface is attached to the microelectronic substrate.

24. The device of claim 22, wherein the base plate further includes at least one sidewall extending from the base plate first surface terminating in a top surface and includes an outer surface, wherein the cap structure sidewall inner surface abuts the base plate sidewall outer surface.

25. The device of claim 24, further including a fluid collection chamber defined between the cap structure plate second surface, the base plate sidewall, the base plate first surface, and the fluid distribution structure.

26. The device of claim 25, wherein the cap structure further includes at least one outlet port with an opening extending through the base plate sidewall to the fluid collection chamber.

27. A method, comprising:
providing a base plate formed as a single component and having a plurality of substantially circular channels formed in the base plate which are substantially concentrically arranged;
providing a fluid distribution structure adjacent to the base plate, wherein the fluid distribution structure has a plurality of inlet conduits extending substantially radially from a central area with each of the plurality of inlet conduits having at least one fluid delivery port extending through the fluid distribution structure to at least one base plate circular channel, and wherein the fluid distribution structure has a plurality of outlet zones defined between adjacent inlet conduits with each of the plurality of outlet zones having at least one fluid removal port extending through the fluid distribution structure to at least one base plate circular channel; and
directing a heat dissipation fluid into the fluid distribution structure central area, wherein at least a portion of the heat dissipation fluid flows into one of the fluid distribution structure inlet conduits, wherein at least a portion of the heat dissipation fluid flows through at least one of the fluid delivery ports and into at least one base plate channel, and wherein [a portions] at least a portion of the heat dissipation fluid exits from the at least one base plate channel through at least one of the fluid distribution structure fluid removal ports into at least one of the fluid distribution structure outlet zones.

28. The method of claim 27, further comprising providing a cap structure assembled with the base plate and the fluid distribution structure, wherein the cap structure includes a plate having an inlet port formed therethrough from a first surface of the cap structure plate to an opposing second surface of the cap structure plate, wherein the cap structure inlet port is positioned to provide an opening to the fluid distribution structure central area, and wherein directing a heat dissipation fluid into the fluid distribution structure central area comprises directing a heat dissipation fluid through the inlet port into the fluid distribution structure central area.

29. The method of claim 28, wherein the fluid distribution structure inlet conduits are defined by at least one wall extending from a base of the fluid distribution structure, and further including contacting the at least one fluid distribution structure wall with the cap structure plate second surface to enclose the fluid distribution structure inlet conduits.

30. The method of claim 28, further including directing the heat dissipation fluid from the fluid distribution structure outlet zones to a fluid collection chamber defined between the cap structure plate second surface, the base plate, and the fluid distribution structure.

* * * * *